United States Patent
Randlett

(10) Patent No.: US 7,760,015 B2
(45) Date of Patent: Jul. 20, 2010

(54) COMBINATION OFFSET VOLTAGE AND BIAS CURRENT AUTO-ZERO CIRCUIT

(75) Inventor: Richard W. Randlett, Palo Alto, CA (US)

(73) Assignee: Exar Corporation, Fremont, CA (US)

(*) Notice: Subject to any disclaimer, the term of this patent is extended or adjusted under 35 U.S.C. 154(b) by 51 days.

(21) Appl. No.: 12/127,912

(22) Filed: May 28, 2008

(65) Prior Publication Data

US 2009/0231029 A1  Sep. 17, 2009

Related U.S. Application Data

(60) Provisional application No. 61/036,357, filed on Mar. 13, 2008.

(51) Int. Cl.
  H03F 1/02 (2006.01)
  H03F 3/08 (2006.01)
(52) U.S. Cl. .......................... 330/9; 330/308
(58) Field of Classification Search ............... 330/9, 330/308; 327/124, 307; 250/214 A
See application file for complete search history.

(56) References Cited

U.S. PATENT DOCUMENTS

| 4,430,622 | A | 2/1984 | Simoes |
| 5,654,668 | A | 8/1997 | Botti et al. |
| 5,786,729 | A | 7/1998 | Smith |
| 6,084,478 | A | 7/2000 | Mayampurath |
| 6,339,363 | B1* | 1/2002 | Fowler ........................ 330/308 |
| 7,538,605 | B2* | 5/2009 | Yen ............................... 330/9 |
| 2002/0134918 | A1 | 9/2002 | Miida |
| 2007/0126499 | A1 | 6/2007 | Chen |
| 2007/0228258 | A1 | 10/2007 | Yamaguchi et al. |

FOREIGN PATENT DOCUMENTS

GB  2210744  6/1989
JP  58111509  7/1983

OTHER PUBLICATIONS

International Search Report for PCT/US2009/036544, dated May 11, 2009, 10 pages.

* cited by examiner

*Primary Examiner*—Steven J Mottola
(74) *Attorney, Agent, or Firm*—Fliesler Meyer LLP

(57) ABSTRACT

A circuit with an input acquisition loop and an output acquisition loop is used to compensate for the input offset voltage and bias current errors of an operational amplifier.

17 Claims, 2 Drawing Sheets

$$\tau_1 = R_F C_D$$

$$\tau_2 = \frac{R_F C_D}{(1 + A(s))}$$

$$BW = \frac{1}{2\pi \tau_2}$$

US 7,760,015 B2

COMBINATION OFFSET VOLTAGE AND BIAS CURRENT AUTO-ZERO CIRCUIT

CLAIM OF PRIORITY

This application claims priority to U.S. Provisional Application No. 61/036,357 entitled "COMBINATION OFFSET VOLTAGE AND BIAS CURRENT AUTO-ZERO CIRCUIT" by Richard W. Randlett, filed Mar. 13, 2008, which is hereby incorporated by reference.

BACKGROUND OF INVENTION

Photodiode-transimpedance amplifier combinations are used in a laser power control circuit for DVD applications. The first order limitation to achieving high speed in combination with high precision in this circuit lies with the magnitude of the photodiode parasitic capacitance. As shown in FIG. 1, traditional circuits use the feedback resistor and diode capacitance time constant to set the dominant pole of the circuit. This time constant, divided by $(1+A_{VOL})$, where $A_{VOL}$ is the open loop gain of the amplifier, sets the bandwidth of the circuit. Note that the internal pole of the amplifier becomes the secondary pole.

From a speed and accuracy viewpoint, this circuit has several limitations. First, the open loop gain is limited by the need to have the secondary pole, contributed by the amplifier, out far enough in frequency so as to not contribute excessive phase shift in the closed-loop response, which leads to instability. On the other hand, limited open-loop gain limits the maximum value of the transimpedance-setting resistor, RF, in the feedback if we are to achieve a given bandwidth.

A possible solution to this problem is utilization of a current-mode-feedback amplifier, (CMFA), as the transimpedance amplifier. CFMA's have inherently low open loop input impedance (looking into the emitters of a complementary NPN, PNP pair). As a result, the secondary pole formed by the diode capacitance and the input resistance of the amplifier is an order of magnitude away from the required amplifier bandwidth and has no effect on circuit response. As a result, the amplifier can be compensated internally by conventional means and the magnitude of the open loop gain $A_{VOL}$, is not limited.

However, the CFMA approach has significant accuracy limitations. CFMA's have extremely high input offset voltages and bias currents compared to voltage feedback amplifiers and this largely prevents their use in this application.

DETAILED DESCRIPTION

Figure 1:
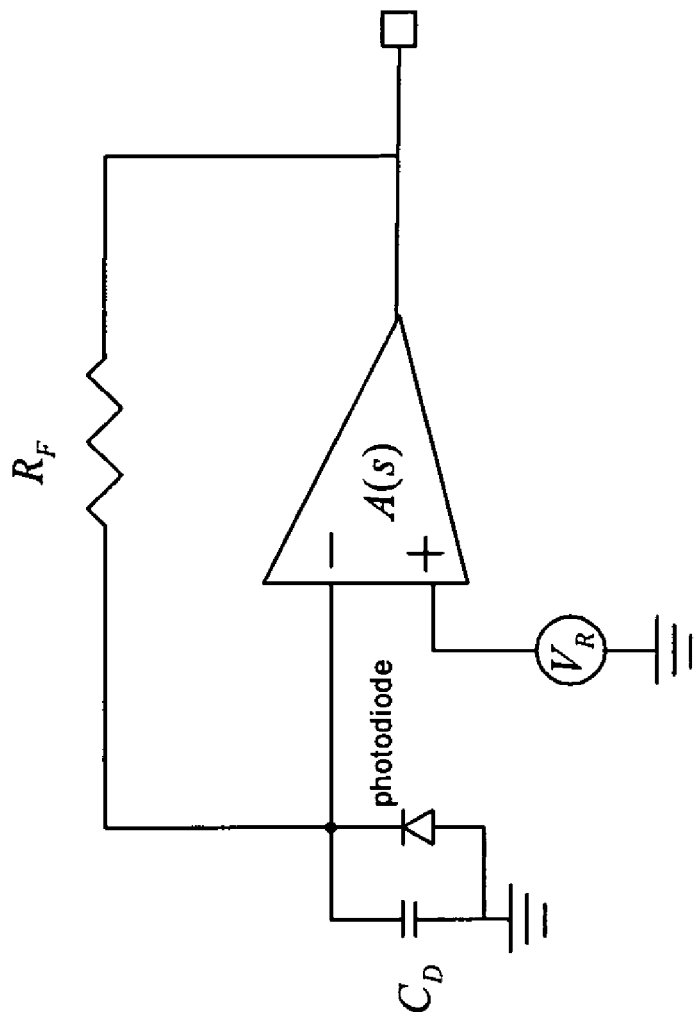
FIG. 1 shows a diagram of a prior art photodiode transimpedance amplifier.
Figure 2:
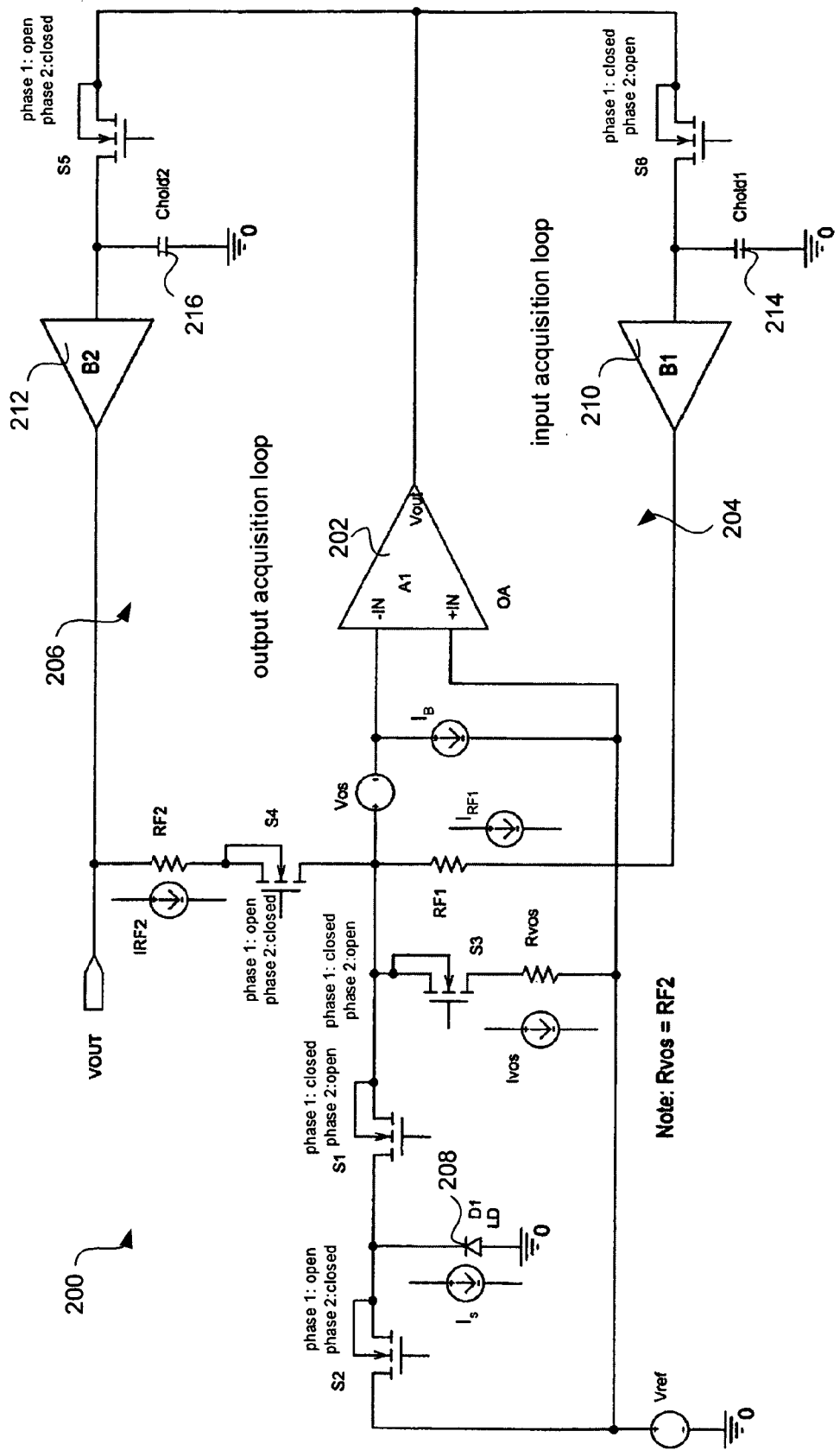
FIG. 2 shows a diagram of a photodiode transimpedance amplifier circuit of one embodiment of the present invention.

As shown in FIG. 2, one embodiment of the present invention is a circuit 200 comprising an operational amplifier 202; an input acquisition loop 204; and an output acquisition loop 206. The output of the operational amplifier 202 can pass through the input acquisition loop 204 in a first phase and through the output acquisition loop 206 in a second phase. The circuit 200 can compensate for the input offset voltage and bias current errors of the operational amplifier.

The operational amplifier 202 can be a CMFA amplifier, such as a transimpedance amplifier. In one embodiment, operational amplifier 202 can be an operational transimpedance amplifier (OTA). A voltage drop across a resistor, $R_{F2}$, in the output acquisition loop 206 can compensate for the input offset voltage of the operational amplifier. Another resistor, Rvos, can switched in across the inputs to the operational amplifier in the first phase. The value of resister $R_{VOS}$ can be equal to the value of resister $R_{F2}$.

A photodiode 208 can produce an input current to the circuit. The photodiode can be used to detect information from an optical medium, such as an optical disk like a CD or DVD. The output of the photodiode can be directed towards different inputs of the operational amplifier 202 in the first and second phase.

The circuit can compensate for both input offset voltage and bias current errors on any type of operational amplifier and enable a high degree of precision to be maintained over a wide range of operating conditions.

The operation of the circuit can be divided into two phases. Phase one being input acquisition and phase 2 being output acquisition.

The input acquisition and output acquisition loops 204 and 206 can include buffers 210 and 212 as well as sampling capacitors 214 and 216. Buffers 210 and 212 can be simple source followers with Class AB output stages for drive capability.

The first phase can be an Input Signal Acquisition phase. In the first phase, switches S1, S3, S6 can be closed such that current can pass through them. Switches S2, S4, S5 can be open such that current is blocked from passing through them.

In the first phase, the input acquisition loop 204 is closed around the operational amplifier 202 and buffer 210. Summing the currents at the input to operation amplifier 202 we have:

$$I_S + I_B + I_{VOS} + I_{RF1} = 0 \quad \quad 1)$$

$$I_{RF1} = -(I_S + I_B + I_{VOS}) \quad \quad 2)$$

The second phase is an Output Signal Acquisition phase. Switches S1, S3, S6 are open. Switches S2, S4, S5 are closed.

In this condition, the output acquisition loop 206 is closed around A1 and B2. Summing the currents at the input to operational amplifier 202 we have:

$$I_{RF1} + I_{VOS} + I_B + I_{RF2} = 0 \quad \quad 3)$$

Substituting 2 into 3:

$$-I_S - I_B - I_{VOS} + I_B + I_{RF2} = 0 \quad \quad 4)$$

Cancelling terms:

$$-I_S - I_{VOS} + I_{RF2} = 0 \quad \quad 5)$$

$$I_{RF2} = I_{VOS} + I_S \text{ therefore} \quad \quad 6)$$

$$V_{OUT} = R_{F2}(I_{VOS} + I_S) \quad \quad 7)$$

The switch S3 and the resister $R_{VOS}$ allows both input offset voltage and current errors to be cancelled. Since $R_{F2} = R_{VOS}$, the $I_{VOS}$ term in the $V_{OUT}$ equation results in a voltage drop across $R_{F2}$ that compensates for the $V_{OS}$ of the op amp.

Errors contributed by both input offset voltage and bias current can be compensated with this scheme. This differs significantly from other auto-zero schemes that account only for the offset voltage. As a result, we can apply the principles to conventional bipolar input op amps as well as low-impedance-input current feedback amplifiers where input offset voltages and bias currents are a significant contributor to error. This can be the key to obtaining very high speed performance in photodetector-based transimpedance amplifier applications.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A circuit comprising:
    an operational amplifier; and
    an input acquisition loop; and
    an output acquisition loop; wherein the output of the operational amplifier goes through the input acquisition loop in a first phase and through the output acquisition loop in a second phase and wherein the circuit compensates for the input offset voltage and bias current errors of the operational amplifier; and
    wherein a first resistor is switched in across the inputs of the operational amplifier in the first phase.

2. The circuit of claim 1, wherein the operational amplifier is a current-mode-feedback amplifier (CMFA) amplifier.

3. The circuit of claim 1, wherein the operational amplifier is a transimpedance amplifier.

4. The circuit of claim 1, wherein a voltage drop across a resistor in the output acquisition loop compensates for the input offset voltage of the operational amplifier.

5. The circuit of claim 1, further including a photodiode that produces an input current to the circuit.

6. The circuit of claim 5, wherein the photodiode is used to detect information from an optical medium.

7. The circuit of claim 6, wherein the optical medium is an optical disk.

8. The circuit of claims 5, wherein the current from the photodiode is directed towards different inputs of the operational amplifier in the first and second phase.

9. The circuit of claim 1, wherein the input acquisition and output acquisition loop include buffers.

10. A circuit comprising:
    an operational amplifier;
    an input acquisition loop; and
    an output acquisition loop; wherein the output of the operational amplifier goes through the input acquisition loop in a first phase and through the output acquisition loop in a second phase and wherein the circuit compensates for the input offset voltage and bias current errors of the operational amplifier; wherein, in the first phase, current from a photodiode flows through an resistor in parallel with the inputs of the operational amplifier and through one of the inputs of the operational amplifier; and wherein, in the second phase current from the photodiode flows to the other of the inputs of the operational amplifier.

11. The circuit of claim 10, wherein the operational amplifier is a current-mode-feedback amplifier (CMFA) CMFA amplifier.

12. The circuit of claim 10, wherein the operational amplifier is a transimpedance amplifier.

13. The circuit of claim 10, wherein a voltage drop across a resistor in the output acquisition loop compensates for the input offset voltage of the operational amplifier.

14. The circuit of claim 13, wherein the photodiode is used to detect information from an optical medium.

15. The circuit of claim 14, wherein the optical medium is an optical disk.

16. The circuit of claim 10, wherein the input acquisition and output acquisition loop include buffers.

17. The circuit of claim 1, wherein the output acquisition loop includes a second resistor that matches the first resistor.

* * * * *